(12) United States Patent
Rusu et al.

(10) Patent No.: US 12,046,580 B2
(45) Date of Patent: Jul. 23, 2024

(54) THREE-DIMENSIONAL INTEGRATED CIRCUIT (3D IC) LOW-DROPOUT (LDO) REGULATOR POWER DELIVERY

(71) Applicant: Taiwan Semiconductor Manufacturing Company, Ltd., Hsinchu (TW)

(72) Inventors: Stefan Rusu, Sunnyvale, CA (US); Mohammed Rabiul Islam, Austin, TX (US); Eric Soenen, Austin, TX (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 198 days.

(21) Appl. No.: 17/559,718

(22) Filed: Dec. 22, 2021

(65) Prior Publication Data

US 2022/0302089 A1    Sep. 22, 2022

Related U.S. Application Data

(60) Provisional application No. 63/163,295, filed on Mar. 19, 2021.

(51) Int. Cl.
*H01L 25/065* (2023.01)
*H01L 23/00* (2006.01)
*H01L 25/00* (2006.01)

(52) U.S. Cl.
CPC .......... *H01L 25/0657* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01)

(58) Field of Classification Search
CPC ..... H01L 25/0657; H01L 24/08; H01L 24/80; H01L 25/50; H01L 2224/08145; H01L 2224/80895; H01L 2224/80896; H01L 2225/1058
See application file for complete search history.

(56) References Cited

U.S. PATENT DOCUMENTS

2019/0273073 A1* 9/2019 Murtuza ........... H01L 23/49822

* cited by examiner

*Primary Examiner* — Thanh Y. Tran
(74) *Attorney, Agent, or Firm* — MERCHANT & GOULD P.C.

(57) ABSTRACT

A three-dimensional integrated circuit (3D IC) package is provided. The 3D IC package includes: a cache die including a low-dropout (LDO) regulator and a cache memory device; a compute die above the cache die, the compute die including a processor; and one or more first interconnect structures connecting the cache die and the compute die in a vertical direction.

20 Claims, 8 Drawing Sheets

THREE-DIMENSIONAL INTEGRATED CIRCUIT (3D IC) LOW-DROPOUT (LDO) REGULATOR POWER DELIVERY

PRIORITY CLAIM AND CROSS-REFERENCE

This application claims priority to U.S. Provisional Application No. 63/163,295, filed Mar. 19, 2021, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a constant need to develop ICs with lower power consumption, better performance, smaller chip areas, and lower costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional integrated circuit (3D IC) is an IC manufactured by stacking silicon wafers or dies and interconnecting them vertically using, for instance, through-silicon vias (TSVs), hybrid boding (HB), or Cu—Cu connections, so that they behave as a single device to achieve performance improvements at reduced power and smaller footprint than conventional two dimensional processes. The 3D IC is one of several 3D integration schemes that exploit the z-direction to achieve electrical performance benefits, in microelectronics and nanoelectronics.

A low-dropout (LDO) regulator is a DC linear voltage regulator that can regulate the output voltage even when the supply voltage is very close to the output voltage. The advantages of LDO regulator over other DC to DC regulators include the absence of switching noise, smaller device size, and great design simplicity. LDO regulators are rated in terms of performance metrics, including drop-out voltage, standby current, load regulation, line regulation, maximum current, speed (responsiveness in the presence of varying loads), and output voltage variations (e.g., undershoot and overshoot) due to transients in load current, among others.

In accordance with embodiments of the disclosure, LDO regulators are located in a cache die, which is stacked between a substrate and a compute die, rather than located in the compute die. The compute die is typically fabricated using an advanced technology node. The cache die, on the other side, is typically fabricated using a mature technology node. The mature technology node is an older generation of fabrication process compared with the advanced technology. In other words, the mature technology node is relative to the advanced technology node. The advanced technology node has a smaller contacted poly pitch (CPP) and a smaller minimum metal pitch (MMP) than the mature technology node. In a non-limiting example, the advanced technology node may be Node 3 (i.e., 3 nm) or Node 5 (i.e., 5 nm), while the mature technology node may be Node 7 (i.e., 7 nm) or Node 10 (i.e., 10 nm). In another non-limiting example, the advanced technology node may be Node 7, while the mature technology node may be Node 10. As the LDO regulators are located in the cache die fabricated using the mature technology node, silicon area cost in the compute die fabricated using the advanced technology node can be reduced, lowering the overall cost of the 3D IC significantly.

On the other hand, as the cache die is stacked under the compute die using, for example, hybrid bond (HB) structures, power can be delivered vertically with little lateral distribution, therefore resulting in shorter sense lines and lower IR drops. The overall power delivery performance is improved. The details will be described with reference to FIGS. 1-7 below.

Figure 1:
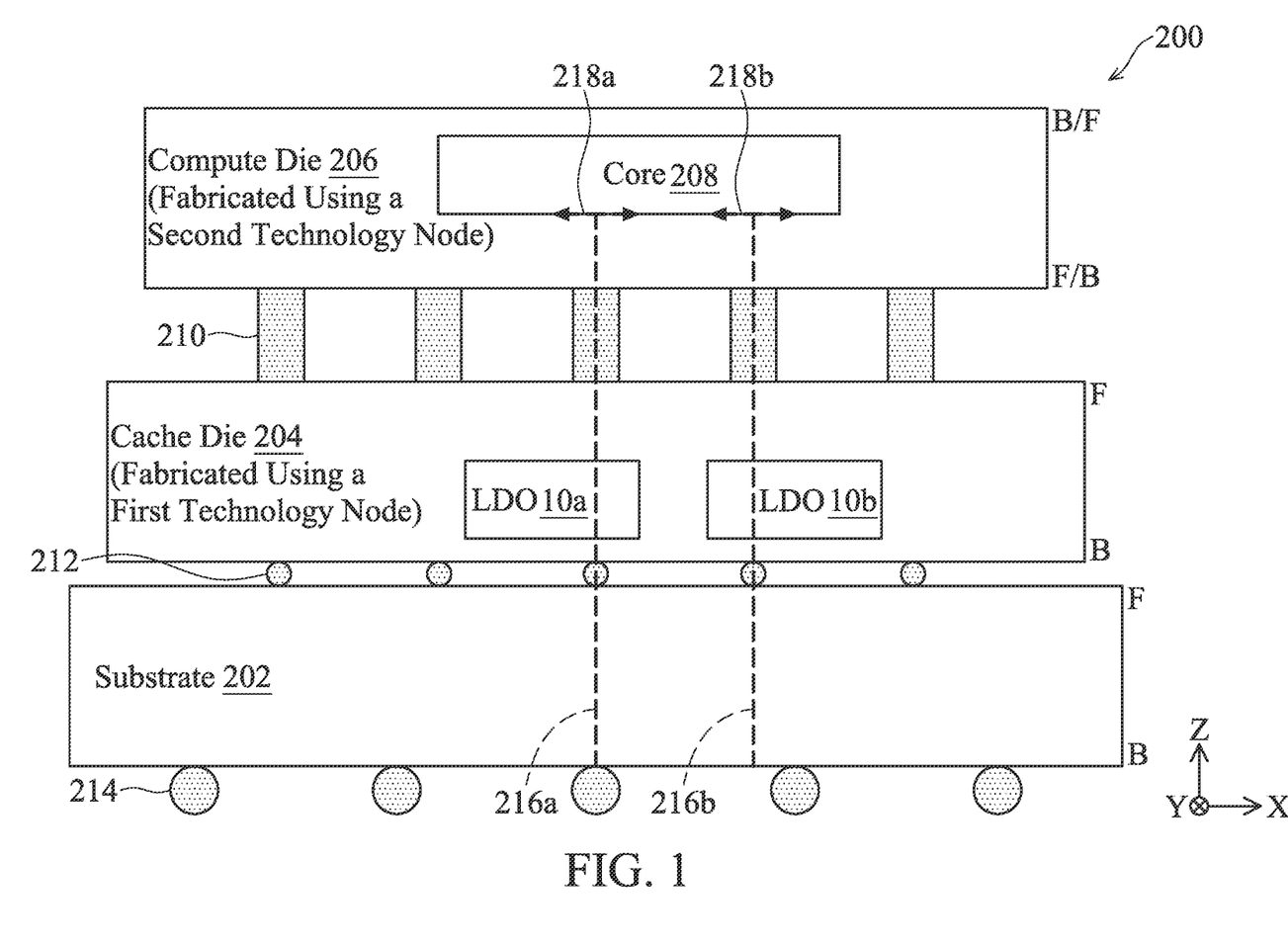
FIG. 1 is a diagram illustrating a 3D IC package in accordance with some embodiments.

FIG. 1 is a diagram illustrating a 3D IC package 200 in accordance with some embodiments. In the example shown in FIG. 1, the 3D IC package 200 includes two stacked IC dies, namely a cache die 204 and a compute die 206, and a substrate 202. The cache die 204 is stacked on the substrate 202 in the Z direction (i.e., the vertical direction), whereas the compute die 206 is stacked on the cache die 204 in the Z direction.

In the example of FIG. 1, the compute die 206 includes, among other things, a processor core ("cores") 208. A core is an individual processor within a central processing unit (CPU). In other embodiments, the compute die 206 may include a multi-core processor having two or more cores, and each of those cores can read and execute program instructions. The program instructions are ordinary CPU instructions (such as add, move data, and branch) but the single processor can run program instructions on separate cores at the same time, increasing overall speed for programs that support multithreading or other parallel computing techniques. As mentioned above, the compute die 206 is fabricated using a second technology node, which is an advanced technology node.

In the example of FIG. 1, the cache die 204 includes one or more cache memory devices and two LDO regulators 10a and 10b (collectively, "10"). It should be noted that the cache die 104 may include other numbers of LDO regulators 10, such as one LDO regulator 10, three LDO regulators 10, eight LDO regulators 10, and so on. The one or more cache memory devices included in the cache die 204 store data so that future request for that data can be served faster. The data stored in the one or more cache memory devices might be the result of an earlier computation or a copy of data stored elsewhere. The more requests that can be served from the one or more caches, the faster the system performs. In one embodiment, each cache memory device is a static random-access memory (SRAM) device. It should be noted that each cache memory device may be other types of memory devices, such as magnetoresistive random-access memory (MRAM), resistive random-access memory (RRAM), ferroelectric random-access memory (FRAM), and phase-change random-access memory (PCRAM). An exemplary LDO regulator 10 is described in detail below with reference to FIG. 7. As mentioned above, the cache die 204 is fabricated using a first technology node, which is a mature technology node. Again, the mature technology node is relative to the advanced technology node, as explained above.

Each of the substrate 202, the cache die 204 and the compute die 206 has a front side (F) and a back side (B). In the example shown in FIG. 1, the back side of the cache die 204 is facing the front side of the substrate 202; the front side of the cache die 204 is facing either the front side or the back side of the compute die 206. The cache die 204 and the compute die 206 are connected to each other by interconnect structures 210. In one embodiment, the interconnect structures 210 are hybrid bonding (HB) structures. Details of HB structures will be described below with reference to FIG. 3. In other embodiments, the interconnect structures 210 may be through substrate vias (TSVs) (also referred to as through-silicon vias in the case where the IC dies are fabricated on a silicon substrate), metal patterns, conductive vias, redistribution layer, or the like. The cache die 204 and the substrate 202 are connected to each other by interconnect structures 212. In one embodiment, the interconnect structures 212 are controlled collapse chip connection (C4) bumps. The C4 bumps are made of a material such as tin, or other suitable materials, such as silver or copper. In other embodiments, the interconnect structures 212 may be other contact bumps such as micro-bumps. The substrate 202 has interconnect structures 214 for connecting the 3D IC package 200 with outside components such as a printed circuit board (PCB). In one embodiment, the interconnect structures 214 are package bumps. Although FIG. 1 only shows five interconnect structures 210, five interconnect structures 212, and five interconnect structures 214, this is just for illustrative purpose. Any desired number of interconnect structures 210, 212, and 214 may be provided.

LDO regulators are conventionally located in a compute die and beside cores. In the example of FIG. 1, the LDO regulators 10a and 10b are located in the cache die 204, which is underneath the compute die 206. In one embodiment, the LDO regulators 10a and 10b may be located between sub-arrays of the cache memory device. Since the LDO regulators 10a and 10b are located in the cache die 204, silicon area cost in the compute die 206 fabricated using the second technology node (i.e., the advanced technology node) can be reduced, lowering the overall cost of the 3D IC package 200 significantly.

On the other hand, the LDO regulators 10a and 10b are located in the cache die 204 which is underneath the compute die 206, power are delivered vertically (i.e., in the Z direction) from the substrate 202 up to the LDO regulators 10a and 10b and eventually up to the compute die 206 through the interconnect structures (e.g., HB structures) 210, as shown as dashed arrows 216a and 216b, respectively. Once the power is delivered vertically to the compute die 206, lateral (i.e., horizontal in the X-Y plane) delivery of the power can be done in the compute die 206. Compared with LDO regulators that are conventionally located in the compute die and beside the core(s), the LDO regulators 10a and 10b located underneath the core 208 in the example of FIG. 1 can achieve little lateral distribution (as shown as the dashed arrows 218a and 218b, respectively) of the power, therefore resulting in shorter sense lines and lower IR drops.

Figure 2:
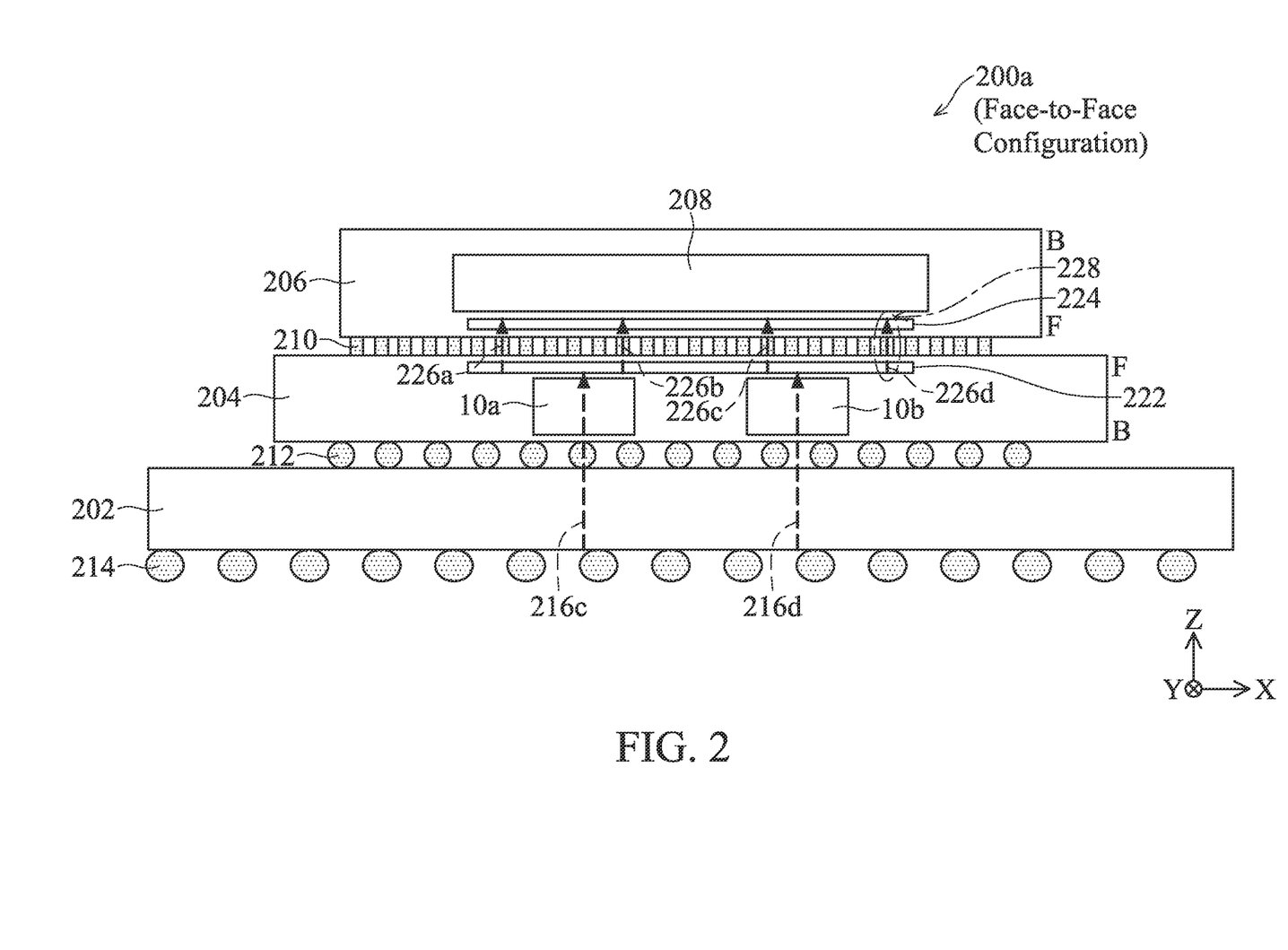
FIG. 2 is a diagram illustrating a 3D IC package in a face-to-face configuration in accordance with some embodiments.
Figure 3:
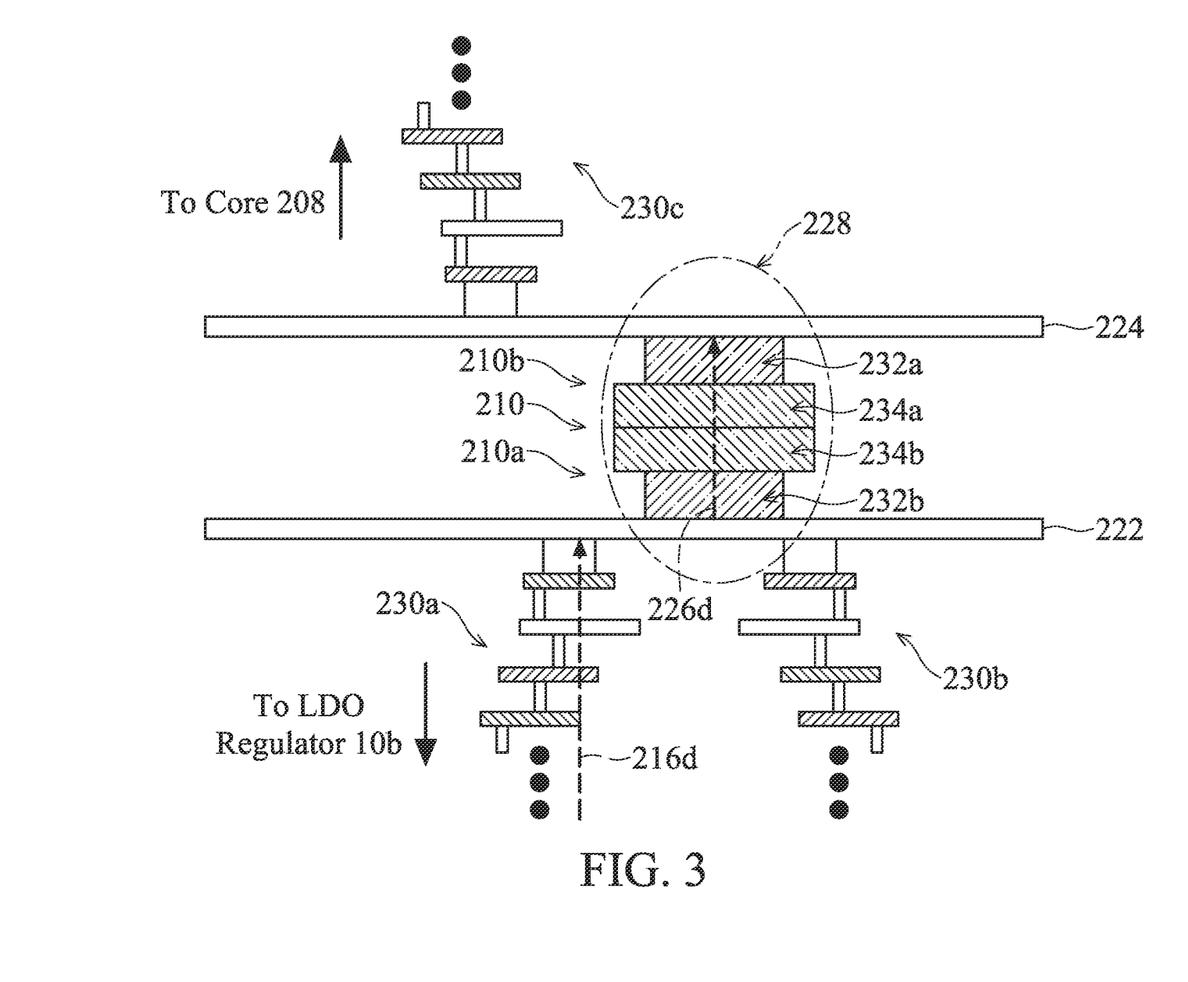
FIG. 3 is a diagram illustrating a region of FIG. 2 in accordance with some embodiments.

FIG. 2 is a diagram illustrating a 3D IC package 200a in a face-to-face configuration in accordance with some embodiments. FIG. 3 is a diagram illustrating the region 228 of FIG. 2 in accordance with some embodiments. The 3D IC package 200a is one implementation of the 3D IC package 200 of FIG. 1, and they are similar in many aspects. Thus, like reference numerals indicate like components, and the details thereof are not repeated for simplicity. In general, a top metal layer 222 in the cache die 204 is utilized to distribute power, in the form of output of the LDO regulators 10a and 10b, laterally (i.e., in the horizontal X-Y plane) before distributing power vertically to the compute die 206.

The front side of the compute die 206 is facing the front side of the cache die 204. The top metal layer 222 of the cache die 204 is on the top of the cache die 204. The top metal layer 224 of the compute die 206 is at the bottom of the compute die 206. The top metal layer 222 and the top metal layer 224 are electrically connected through the interconnect structures 210, in this embodiment HB structures 210. As such, the power are distributed laterally (i.e., in the horizontal X-Y plane) before being distributed vertically to the compute die 206, shown as dashed arrows 226a, 226b, 226c, and 226c. Once the power is delivered vertically to the compute die 206, the power can be distributed to different locations of the core 208 accordingly, further utilizing the top metal layer 224 of the compute die 206. The use of multiple (two in this example of FIG. 2) LDO regulators, the top metal layer 222, the top metal layer 224, and the HB structures 210 facilitates the power delivery design flexibility. As explained below with reference to FIG. 5, different voltage domains can be delivered to different regions (called different "voltage islands") of the core 208.

As shown in FIG. 3, the region 228 is where the top layer metal 222, the HB structure 210, and the top metal layer 224 interact with each other. Two multi-layer interconnect (MLI) structures 230a and 230b are connected to the top metal layer 222. The MLI structure 230a connects the LDO regulator 10b to the top metal layer 222, and the MLI structure 230b may connect one or more cache memory device to the top metal layer 222. Each of the MLI structures 230a and 230b includes, among other things, multiple metal layers and vias connecting those multiple metal layers. In one non-limiting example, the MLI structure 124 includes the first metal (M1) layer, the second metal (M2) layer, the third metal (M3) layer, the fourth metal (M4) layer, the fifth metal (M5) layer all the way up to the fourteenth metal (M14) layer. Complicated routing of the cache die 204 may be achieved by utilizing a number of MLI structures. Likewise, a MLI structure 230c is connecting the top metal layer 224 to the core 208. Complicated routing of the compute die 206 may be achieved by utilizing a number of MLI structures.

Hybrid bonding (HB) is a technology that may be used for wafer-to-wafer, die-to-wafer, and die-to-die interconnection. In hybrid bonding, two structures are bonded together using different materials with a wafer bonder. Specifically, two dies/wafers are bonded together using a combination of two technologies, namely a dielectric-to-dielectric bond and a metal-to-metal bond, often at room temperature. In one embodiment, the dielectric-to-dielectric bond is followed by the metal-to-metal bond. In one embodiment, the metal-to-metal bond is a copper-to-copper bond. Hybrid bonding may enable 250,000 to 1 million interconnect structures per square millimeter, much more than other technologies such as micro-bumps do.

In the example shown in FIG. 3, the HB structure 210 includes, among other things, a HB half 210a at the front side of the cache die 204 and a HB half 210b at the front side of the compute die 206. The HB half 210a includes, among other things, a hybrid bonding metal layer 234b and a hybrid bonding contact structure 232b underneath the hybrid bonding metal layer 234b. The hybrid bonding contact structure 232b is a via in one embodiment. The hybrid bonding contact structure 232b is connected to the top metal layer 222. In a non-limiting example shown in FIG. 3, the top metal layer 222 is the fourteenth metal (M14) layer. Likewise, the HB half 210b includes, among other things, a hybrid bonding metal layer 234a and a hybrid bonding contact structure 232b on the top of the hybrid bonding metal layer 234a. The hybrid bonding contact structure 232a is a via in one embodiment. The hybrid bonding contact structure 232a is connected to the top metal layer 224. In a non-limiting example shown in FIG. 3, the top metal layer 224 is the fourteenth metal (M14) layer. In summary, the power is delivered vertically first (shown as the dashed arrow 216d), then laterally, and eventually vertically to the top metal layer 224 (shown as the dashed arrow 226d).

Figure 4:
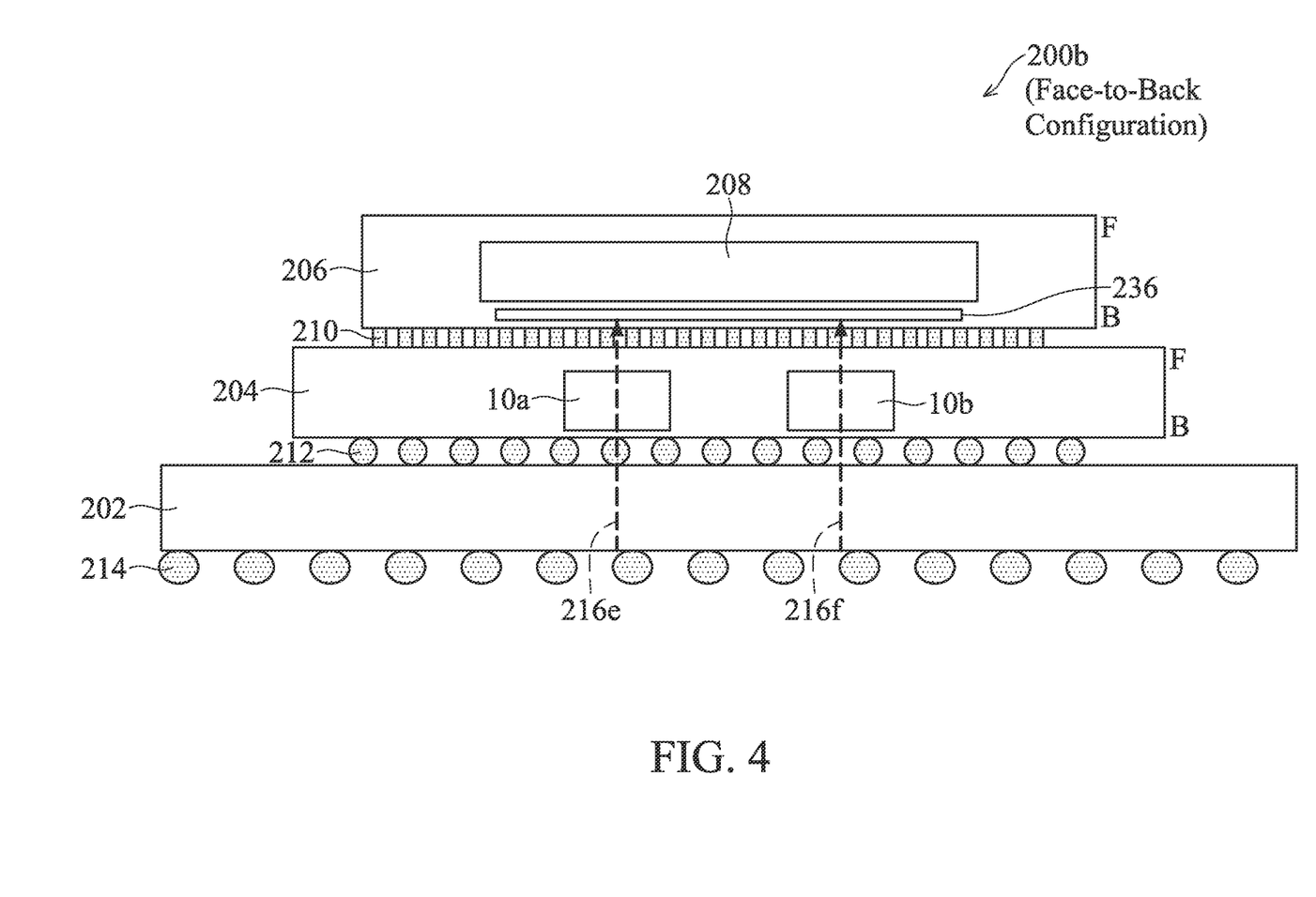
FIG. 4 is a diagram illustrating a 3D IC package in a face-to-back configuration in accordance with some embodiments.

FIG. 4 is a diagram illustrating a 3D IC package 200a in a face-to-back configuration in accordance with some embodiments. The 3D IC package 200b is one implementation of the 3D IC package 200 of FIG. 1, and they are similar in many aspects. Thus, like reference numerals indicate like components, and the details thereof are not repeated for simplicity. In general, a backside metal layer (BML) 236 at the back side of the compute die 206 is utilized to distribute power laterally (i.e., in the horizontal X-Y plane) after power being distributed vertically to the compute die 206 (shown as dashed arrows 216e and 216f, respectively). The backside metal layer 236 may be used for both power distribution and signal distribution. In some embodiments, the backside metal layer 236 may be made of aluminum, copper, gold, alloys thereof, and so forth, to provide a low resistive metal for distribution of power and signals. In some embodiments, the backside metal layer 236 may be formed with a thickness greater than a normal metal layer in a MLI structure to further reduce resistivity of the backside metal layer 236. The reduced resistivity of the backside metal layer 236 may lead to a lower IR drop. This may be possible since the backside metal layer 236 may not have front side metal layer mechanical stress and via size limitations. In some embodiments, the backside metal layer 236 may be formed to a total thickness of at least two times (2×) the thickness of a normal metal layer in a MLI structure to reduce resistivity thereof. In a non-limiting example, the backside metal layer 236 is a thick copper layer at the back side of the compute die 206.

Figure 5:
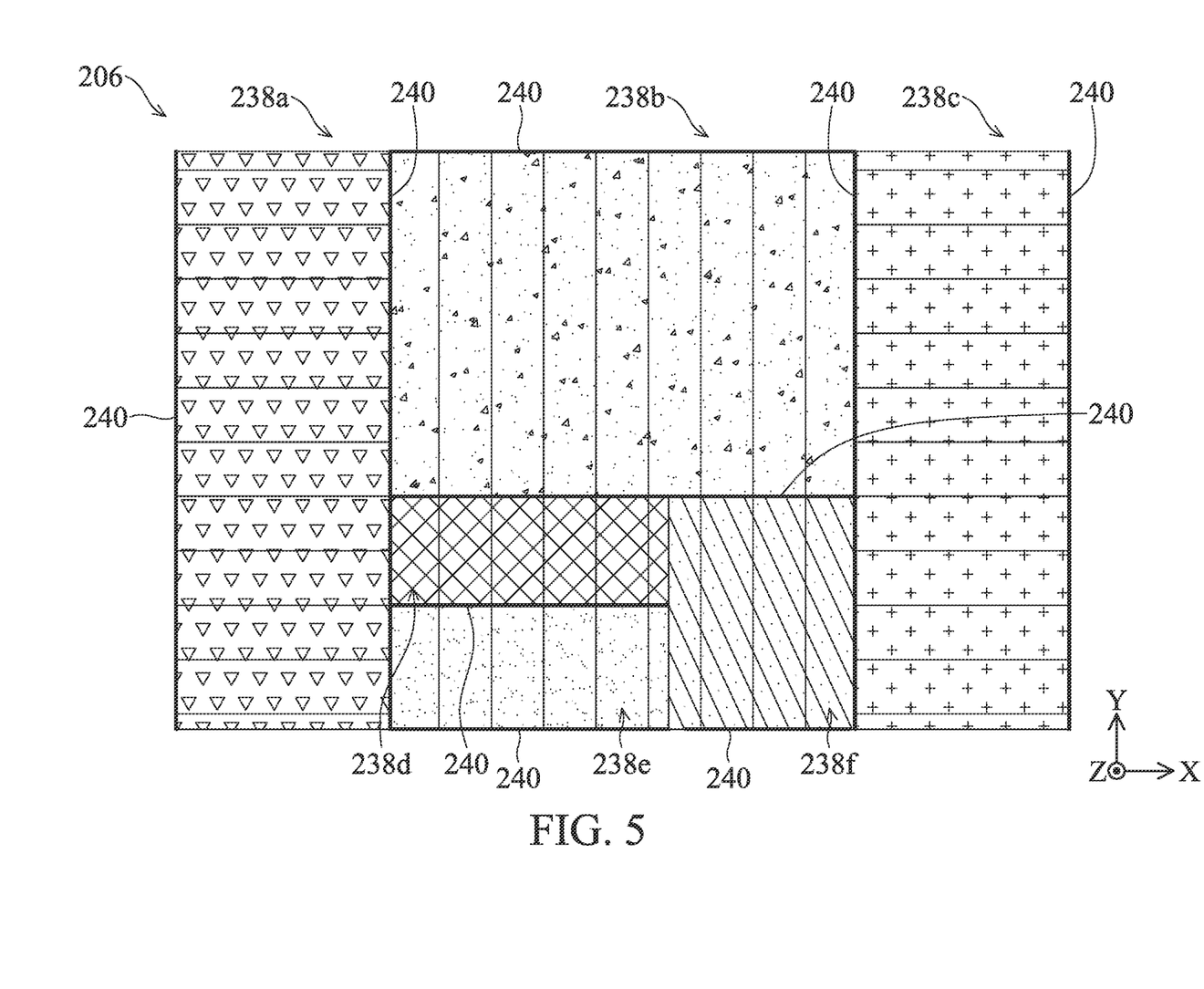
FIG. 5 is a diagram illustrating multiple voltage islands for the compute die 206 in accordance with some embodiments.

FIG. 5 is a diagram illustrating multiple voltage islands 238 for the compute die 206 in accordance with some embodiments. As mentioned above, multiple LDO regulators 10 can be placed in the cache die 204, and different power domains (i.e., different "voltage islands") can be achieved for the compute die 206 with one single input voltage. In the example of FIG. 5, there are six voltage islands 238a, 238b, 238c, 238d, 238e, and 238f (collectively 238) in the compute die 206, corresponding to six different voltage domains. Header switches and footer switches (collectively, "power gates" 240) are typically located on the long sides of each of the voltage islands 238. Power gates 240 are used to cut off power supplies to certain standard logic cells in a standby mode or a sleep mode to save power consumption of the compute die 206. In some implementations, power gates 240 are located at the edges of the voltage islands 238. In the example of FIG. 5, power gates 240 are located at the long sides of the rectangular shapes of the voltage islands 238. For example, the power gates 240 of the voltage island 238a are on the long sides of the voltage island 238a (i.e., along the Y direction); the power gates 240 of the voltage island 238c are on the long sides of the voltage island 238c (i.e., along the Y direction). The power gates 240 of the voltage islands 238b, 238d, 238e, and 238f are on the long sides thereof (i.e., along the X direction). The coexistence of the power gates 240 along the Y direction and along the X direction further increases the design flexibility.

Figure 6:
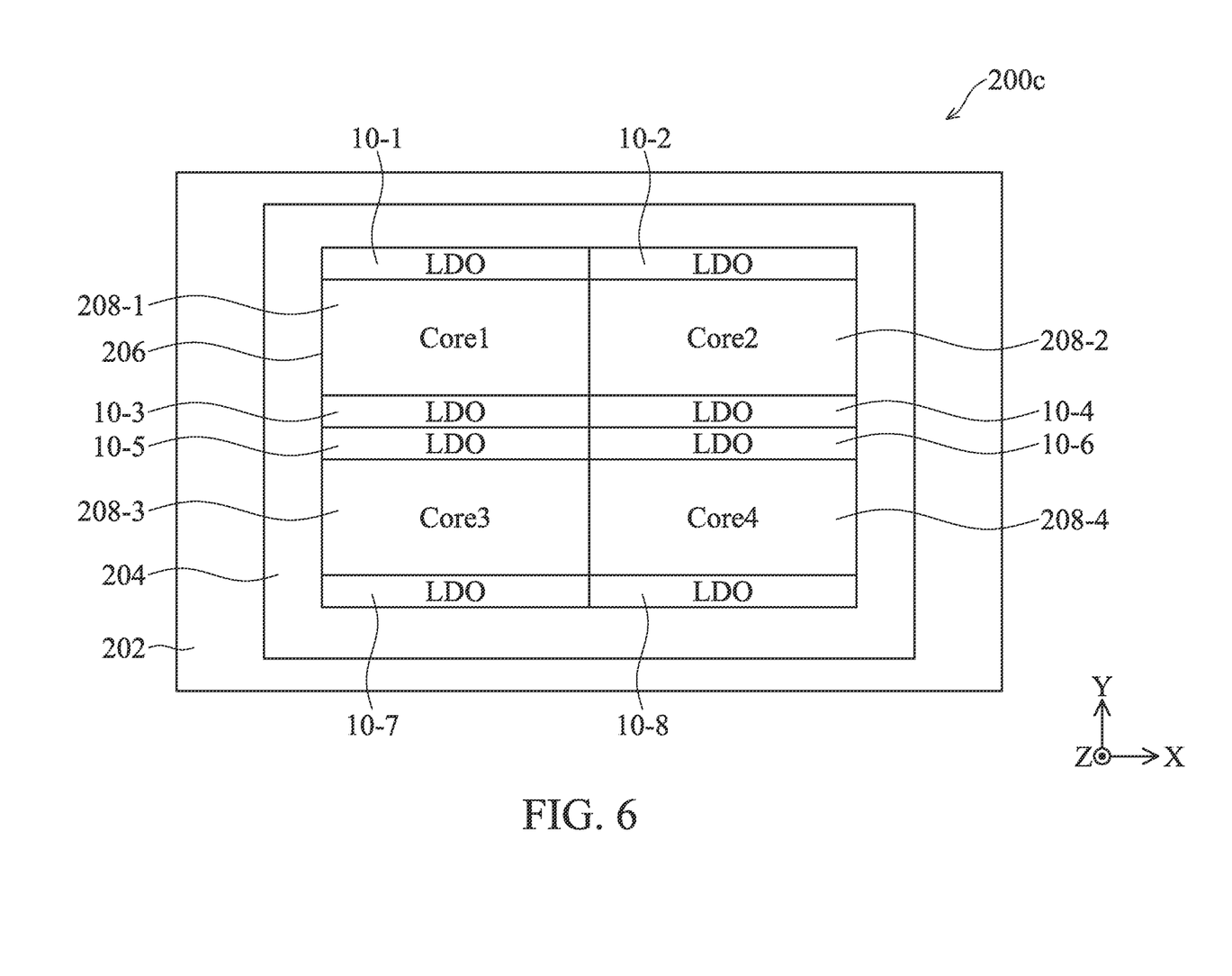
FIG. 6 is a diagram illustrating a 3D IC package in accordance with some embodiments.

FIG. 6 is a diagram illustrating a 3D IC package 200c in accordance with some embodiments. The 3D IC package 200c is one implementation of the 3D IC package 200 of FIG. 1, and they are similar in many aspects. Thus, like reference numerals indicate like components, and the details thereof are not repeated for simplicity. In the example of FIG. 6, the compute die 206 includes four cores 208-1, 208-2, 208-3, and 208-4, arranged in an array having two rows and two columns. The cache die 204 includes eight LDO regulators 10-1, 10-2, 10-3, 10-4, 10-5, 10-6, 10-7, and 10-8. Each of the four cores has a pair of LDO regulators abutting it in the Y direction. The LDO regulators 10-1 and 10-3 are supplying power to the core 208-1; the LDO regulators 10-2 and 10-4 are supplying power to the core 208-2; the LDO regulators 10-5 and 10-7 are supplying power to the core 208-3; the LDO regulators 10-6 and 10-8 are supplying power to the core 208-4. The LDO regulators 10-3, 10-4, 10-5, and 10-6 may be built between sub-arrays of the cache memory device in the cache die 204.

Figure 7:
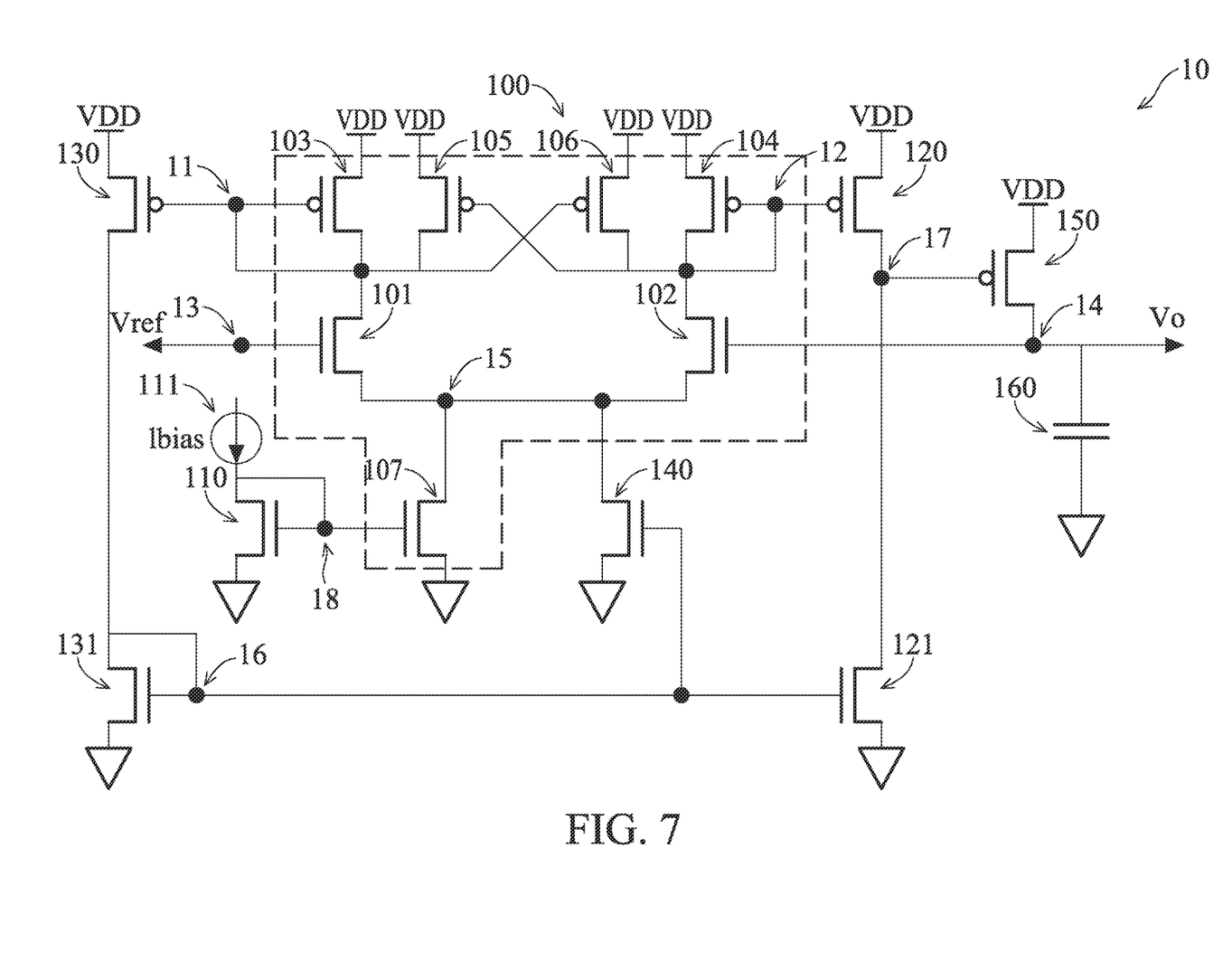
FIG. 7 is a diagram illustrating an example LDO regulator in accordance with some embodiments.

FIG. 7 is a diagram illustrating an example LDO regulator 10 in accordance with some embodiments. It should be noted the LDO regulator 10 in FIG. 7 is just for illustration, and other types of LDO regulators are within the scope of the disclosure. Transistors 101, 102 are a differential pair of an amplifier stage 100. A gate electrode of the transistor 101 is electrically biased by a reference voltage Vref at a node 13. A gate electrode of the transistor 102 is electrically connected to a node 14. The node 14 has voltage level equal to output voltage Vo of the LDO 10. Source electrodes of the transistors 101, 102 are electrically connected to a drain electrode of a transistor 107 (node 15). The transistor 107 provides direct current (DC) current to the amplifier stage 100. A drain electrode of the transistor 101 is electrically connected to a node 11, and a drain electrode of the transistor 102 is electrically connected to a node 12. In some embodiments, the transistors 101, 102, 107 are N-type metal-oxide-semiconductor (NMOS) transistors.

A source electrode of the transistor 107 is electrically connected to a second voltage supply node that supplies a second voltage (e.g., ground). A gate electrode of the transistor 107 is electrically connected to a gate electrode (node 18) of a transistor 110. In some embodiments, the transistor 110 is an NMOS transistor. A drain electrode of the transistor 110 is electrically connected to a current supply 111 that supplies bias current Ibias. A source electrode of the transistor 110 is electrically connected to the second voltage supply node.

Transistors 103, 104 are active loads electrically connected to the transistors 101, 102, respectively. A drain electrode of the transistor 103 is electrically connected to the drain electrode of the transistor 101. A gate electrode of the transistor 103 is electrically connected to the drain electrode of the transistor 103. A source electrode of the transistor 103 is electrically connected to a first voltage supply node that supplies a first voltage VDD.

A drain electrode of the transistor 104 is electrically connected to the drain electrode of the transistor 102. A gate electrode of the transistor 104 is electrically connected to the drain electrode of the transistor 104. A source electrode of the transistor 104 is electrically connected to the first voltage supply node. In some embodiments, the transistors 103, 104 are P-type metal-oxide-semiconductor (PMOS) transistors.

Transistors 120, 121 are a second amplifier stage electrically connected to the node 12. In some embodiments, the transistor 120 is a PMOS transistor, and the transistor 121 is an NMOS transistor. A source electrode of the transistor 120 is electrically connected to the first voltage supply node. A gate electrode of the transistor 120 is electrically connected to the node 12. A drain electrode of the transistor 120 is electrically connected to a node 17.

A source electrode of the transistor 121 is electrically connected to the second voltage supply node. A gate electrode of the transistor 121 is electrically connected to a node 16. A drain electrode of the transistor 121 is electrically connected to the node 17 (the drain electrode of the transistor 120).

Transistors 130, 131 are a current mirror electrically connected to the node 11, the second amplifier stage, and a secondary bias current source 140. In some embodiments, the transistor 130 is a PMOS transistor, and the transistor 131 is an NMOS transistor. A source electrode of the transistor 130 is electrically connected to the first voltage supply node. A gate electrode of the transistor 130 is electrically connected to the node 11. A drain electrode of the transistor 130 is electrically connected to a drain electrode of the transistor 131. A gate electrode of the transistor 131 is electrically connected to the drain electrode of the transistor 131. The gate electrode of the transistor 131 is further electrically connected to the gate electrode of the transistor 121. A source electrode of the transistor 131 is electrically connected to the second voltage supply node. The transistor 131 is diode-connected.

In some embodiments, the secondary bias current source 140 (or "transistor 140") is an NMOS transistor. A drain electrode of the transistor 140 is electrically connected to the source electrodes of the transistors 101, 102 (node 15). A gate electrode of the transistor 140 is electrically connected to the gate electrode of the transistor 131 (node 16). A source electrode of the transistor 140 is electrically connected to the second voltage supply node.

A transistor 150 is a buffer stage electrically connected to the transistor 120 and the node 14 corresponding to the output of the LDO 10. In some embodiments, the transistor 150 is a PMOS transistor. A source electrode of the transistor 150 is electrically connected to the first voltage supply node. A gate electrode of the transistor 150 is electrically connected to the drain electrode of the transistor 120 (node 17). A drain electrode of the transistor 150 is electrically connected to gate electrode of the transistor 102 (node 14).

A capacitor 160 is electrically connected to the node 14 corresponding to the output of the LDO 10. In some embodiments, the capacitor 160 is a polysilicon capacitor, a metal-oxide-metal capacitor, a metal-insulator-metal capacitor, or another such integrated capacitor. In some embodiments, the capacitor 160 is an external capacitor. A first electrode of the capacitor 160 is electrically connected to the gate electrode of the transistor 102 (node 14). A second electrode of the capacitor 160 is electrically connected to the second voltage supply node.

In some embodiments, the amplifier stage 100 further includes transistors 105, 106, which establish positive feedback in the amplifier stage 100 during normal operation. A source electrode of the transistor 105 is electrically connected to the first voltage supply node. A gate electrode of the transistor 105 is electrically connected to the drain electrodes of the transistors 102, 104 (node 12). A drain electrode of the transistor 105 is electrically connected to the drain electrodes of the transistors 101, 103 (node 11).

A source electrode of the transistor 106 is electrically connected to the first voltage supply node. A gate electrode of the transistor 106 is electrically connected to the drain electrodes of the transistors 101, 103 (node 11). A drain electrode of the transistor 106 is electrically connected to the drain electrodes of the transistors 102, 104 (node 12).

In normal operation, the transistor 107 (M1) mirrors the bias current Ibias to power the transistors 101-106 of the amplifier stage 100. The output voltage Vo is established at the node 14 by the transistor 150 and the capacitor 160. Driving strength of the transistor 150 is dependent on source-gate voltage VSG (voltage between VDD and the node 17) of the transistor 150. Voltage at the node 17 is determined by relative strength or weakness of current driving of the transistor 120 versus the transistor 121. When the transistor 120 is turned on more strongly than the transistor 121, the voltage at the node 17 is pulled more strongly toward a first supply voltage (VDD) of the first power supply node. When the transistor 121 is turned on more strongly than the transistor 120, the voltage at the node 17 is pulled more strongly toward a second supply voltage (e.g., ground) of the second power supply node. To raise the output voltage Vo, the voltage at the node 17 may be lowered to increase driving strength (drain current) of the transistor 150. To lower the output voltage Vo, the voltage at the node 17 may be increased to reduce the driving strength of the transistor 150.

The amplifier stage 100 compares the output voltage Vo with the reference voltage Vref. A dip (undershoot) in the output voltage Vo lowers driving strength (drain current) of the transistor 102 (M4) relative to the transistor 101 (M3). The dip may occur when current drawn from the LDO 10 increases suddenly or sharply (e.g., when a large number of devices supplied from the LDO 10 are turned on). Due to the lowered driving strength of the transistor 102, current flowing through the transistors 102, 104, 106 is lowered, and current flowing through the transistors 101, 103, 105 is raised. The transistor 120 mirrors the drain current of the transistor 102, and the transistor 130 mirrors the drain current of the transistor 103. The mirrored drain current that flows through the transistors 130, 131 is mirrored again by the transistor 121. The dip in the output voltage Vo is thus sensed by the amplifier stage 100, and fed back to the transistor 121 to lower the voltage of the node 17. A feedback path for controlling the output voltage Vo includes the transistors 102, 101, and 130. The lowered voltage at the node 17 strengthens the drain current driven by the transistor 150 to pull the output voltage back up toward the reference voltage Vref. The reverse mechanism pulls down the output voltage Vo when a rise (overshoot) occurs in the output voltage Vo. The rise strengthens driving of the transistor 120 through the transistors 102, 104, 106, and weakens driving of the transistor 121 through the feedback path. The voltage at the node 17 is pulled up under these conditions, which reduces rate of charge fed to the capacitor 160 by the transistor 150, and lowers the output voltage Vo as current is drawn from the LDO 10 by circuits electrically connected to the LDO 10.

The transistor 140 speeds up response time of the amplifier stage 100 during an undershoot event. When undershoot occurs, the drain current of the transistor 103 is increased. The drain current of the transistor 103 is mirrored by the transistor 130. The voltage at the node 16 is increased due to the increased mirror current (the drain current of the transistor 130) flowing through the transistor 131 (M11). Increasing the voltage at the node 16 increases gate-source voltage (VGS) of the transistor 140. The increased VGS of the transistor 140 turns on the transistor 140 more strongly to supply higher current to the amplifier stage 100. As a result, the voltage at the node 16 is pulled up more rapidly, which pulls down the voltage at the node 17 more rapidly, and pulls up the output voltage Vo more rapidly.

In some embodiments, the amplifier stage 100 of the LDO further comprises the transistors 105, 106. The transistors 105, 106 are cross-coupled, and provide positive feedback in the amplifier stage 100 to further speed up the response time of the amplifier stage 100. Source electrodes of the transistors 105, 106 are electrically connected to the first voltage supply node. A gate electrode of the transistor 105 is electrically connected to the drain electrodes of the transistors 102, 104, 106. A gate electrode of the transistor 106 is electrically connected to the drain electrodes of the transistors 101, 103, 105.

In an undershoot event, the voltage at the node 12 is raised, and the voltage at the node 11 is lowered. The lowered voltage at the node 11 strengthens current driving of the transistor 106, which serves to enhance pulling up of the voltage 12 toward the first voltage VDD. The raised voltage at the node 12 weakens current driving of the transistor 105, which allows the voltage at the node 11 to be pulled down by the transistor 101 more rapidly.

Figure 8:
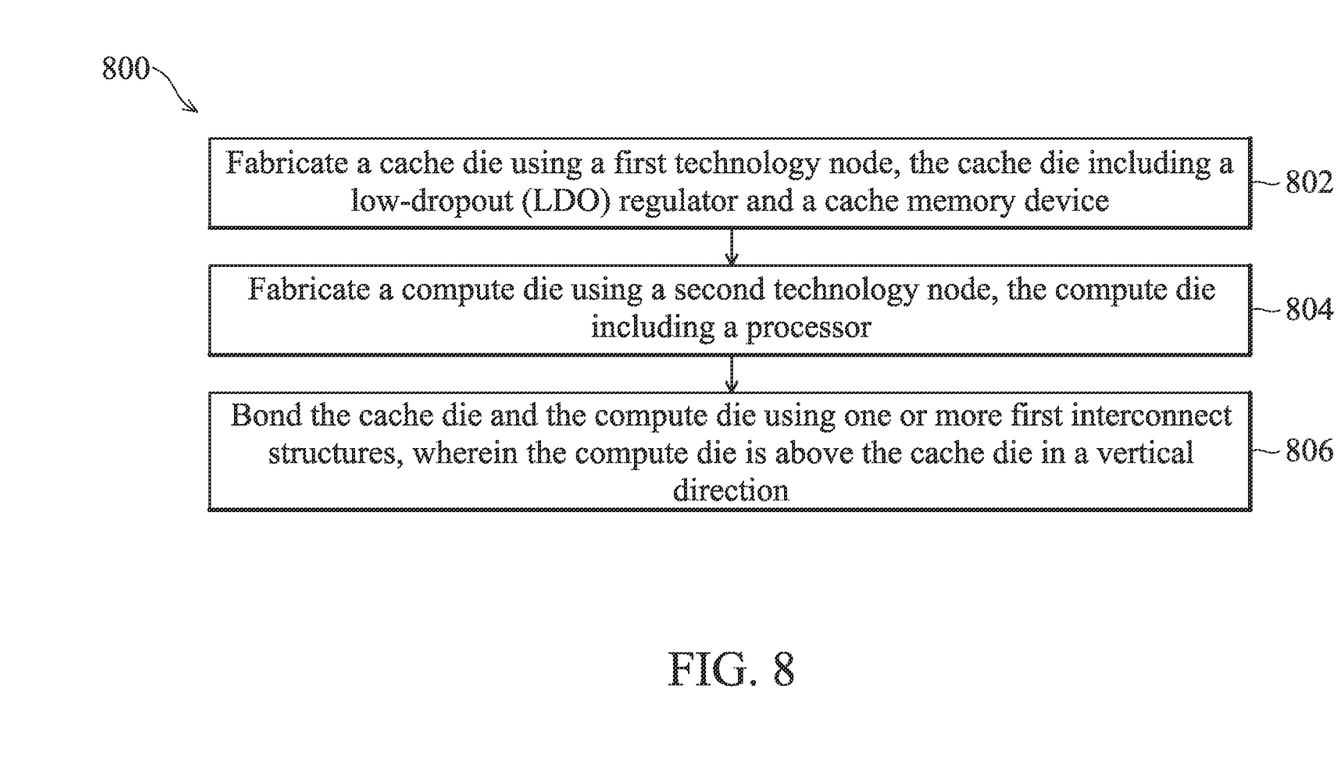
FIG. 8 is a flowchart diagram illustrating a method of fabricating the 3D IC package of FIG. 1 in accordance with some embodiments.

FIG. 8 is a flowchart diagram illustrating a method 800 of fabricating the 3D IC package 200 of FIG. 1 in accordance with some embodiments. The method 800 starts at step 802, where a cache die is fabricated using a first technology node. The cache die includes a LDO regulator and a cache memory device. At step 804, a compute die is fabricated using a second technology node. The compute die includes a processor. At step 806, the cache die and the compute die are bonded using one or more first interconnect structures. The compute die is above the cache die in a vertical direction.

In some embodiments, the LDO 10 includes the transistor 140 and the transistors 130, 131. In some embodiments, the LDO 10 includes the transistors 105, 106. In some embodiments, the LDO includes the transistors 105, 106, and the transistors 130, 131, 140. The auxiliary current source 140 and the cross-coupled transistors 105, 106 speed up recovery time of the LDO 10 in undershoot events.

In accordance with some disclosed embodiments, a three-dimensional integrated circuit (3D IC) package is provided. The 3D IC package includes: a cache die including a low-dropout (LDO) regulator and a cache memory device; a compute die above the cache die, the compute die including a processor; and one or more first interconnect structures connecting the cache die and the compute die in a vertical direction.

In accordance with some disclosed embodiments, a three-dimensional integrated circuit (3D IC) package is provided. The 3D IC package includes: a cache die including a plurality of low-dropout (LDO) regulators and a cache memory device, the plurality of LDO regulators sharing a common input voltage and outputting a plurality of output voltages in a plurality of voltage domains; a compute die above the cache die, the compute die including a processor; and one or more first interconnect structures connecting the cache die and the compute die in a vertical direction, wherein the plurality of output voltages are delivered to a plurality of voltage islands in the compute die.

In accordance with further disclosed embodiments, a method of fabricating a three-dimensional integrated circuit (3D IC) package is provided. The method includes the following steps: fabricating a cache die using a first technology node, the cache die including a low-dropout (LDO) regulator and a cache memory device; fabricating a compute die using a second technology node, the compute die including a processor; and bonding the cache die and the compute die using one or more first interconnect structures, wherein the compute die is above the cache die in a vertical direction.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated circuit (3D IC) package, comprising:
   a cache die including a low-dropout (LDO) regulator and a cache memory device;
   a compute die above the cache die, the compute die including a processor and a plurality of voltage islands, each of the plurality of voltage islands having a rectangular shape with power gates located at the long sides of the rectangular shape; and
   one or more first interconnect structures connecting the cache die and the compute die in a vertical direction and configured to deliver a plurality of output voltages to the plurality of voltage islands.

2. The 3D IC package of claim 1, wherein the cache die is fabricated using a first technology node, the compute die is fabricated using a second technology node, and the second technology node has a smaller contacted poly pitch (CPP) and a smaller minimum metal pitch (MMP) than the first technology node.

3. The 3D IC package of claim 1, wherein the cache die is fabricated using a first technology node, the compute die is fabricated using a second technology node, and the second technology node is advanced than the first technology node.

4. The 3D IC package of claim 1, wherein the processor includes a plurality of processor cores.

5. The 3D IC package of claim 1, wherein the LDO regulator is underneath the processor in the vertical direction.

6. The 3D IC package of claim 1, wherein the one or more first interconnect structures are one or more hybrid bonding (HB) structures.

7. The 3D IC package of claim 1, wherein a front side of the compute die is facing a front side of the cache die.

8. The 3D IC package of claim 7, wherein a cache die top metal layer at the front side of the cache die is connected to the one or more first interconnect structures, and a compute die top metal layer at the front side of the compute die is connected to the one or more first interconnect structures.

9. The 3D IC package of claim 1, wherein a back side of the compute die is facing a front side of the cache die.

10. The 3D IC package of claim 9, wherein a backside metal layer at the back side of the compute die is connected to the one or more first interconnect structures.

11. The 3D IC package of claim 10, wherein the backside metal layer is a thick copper layer.

12. The 3D IC package of claim 1, further comprising:
   a substrate underneath the cache die; and
   one or more second interconnect structures connecting the cache die and the substrate in the vertical direction.

13. A three-dimensional integrated circuit (3D IC) package, comprising:
   a cache die including a plurality of low-dropout (LDO) regulators and a cache memory device, the plurality of LDO regulators sharing a common input voltage and outputting a plurality of output voltages in a plurality of voltage domains;
   a compute die above the cache die, the compute die including a processor; and
   one or more first interconnect structures connecting the cache die and the compute die in a vertical direction, wherein the plurality of output voltages are delivered to a plurality of voltage islands in the compute die;
   wherein each of the plurality of voltage islands has a rectangular shape and has power gates located at the long sides of the rectangular shape.

14. The 3D IC package of claim 13, wherein the cache die is fabricated using a first technology node, the compute die is fabricated using a second technology node, and the second technology node has a smaller contacted poly pitch (CPP) and a smaller minimum metal pitch (MMP) than the first technology node.

15. The 3D IC package of claim 13, wherein the cache die is fabricated using a first technology node, the compute die is fabricated using a second technology node, and the second technology node is advanced than the first technology node.

16. The 3D IC package of claim 13, further comprising:
   a substrate underneath the cache die; and
   one or more second interconnect structures connecting the cache die and the substrate in the vertical direction.

17. A method of fabricating a three-dimensional integrated circuit (3D IC) package, comprising:
   fabricating a cache die using a first technology node, the cache die including a low-dropout (LDO) regulator and a cache memory device;
   fabricating a compute die using a second technology node, the compute die including a processor and a plurality of voltage islands each having a rectangular shape with power gates located at the long sides of the rectangular shape;
   bonding the cache die and the compute die using one or more first interconnect structures, wherein the compute die is above the cache die in a vertical direction; and
   delivering a plurality of output voltages to the plurality of voltage islands in the compute die via the one or more interconnect structures.

18. The method of claim 17, wherein the second technology node has a smaller contacted poly pitch (CPP) and a smaller minimum metal pitch (WIMP) than the first technology node.

19. The method of claim 17, wherein the second technology node is more advanced than the first technology node.

20. The method of claim 17, wherein the one or more first interconnect structures are one or more hybrid bonding (HB) structures.

* * * * *